(12) United States Patent
Beninger-Bina et al.

(10) Patent No.: US 11,501,979 B1
(45) Date of Patent: Nov. 15, 2022

(54) SEMICONDUCTOR DEVICE AND METHOD OF PRODUCING A SEMICONDUCTOR DEVICE

(71) Applicant: Infineon Technologies Austria AG, Villach (AT)

(72) Inventors: Markus Beninger-Bina, Grosshelfendorf (DE); Andreas Behrendt, Villach (AT); Mark Harrison, Wernberg (AT); Robert Hartl, Regensburg (DE); Peter Imrich, Villach (AT); Reinhard Lindner, Maxhütte-Haidhof (DE); Evelyn Napetschnig, Diex (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/350,345

(22) Filed: Jun. 17, 2021

(51) Int. Cl.
*H01L 21/48* (2006.01)
*H01L 21/20* (2006.01)
*H01L 21/28* (2006.01)

(52) U.S. Cl.
CPC ...... *H01L 21/4846* (2013.01); *H01L 21/2007* (2013.01); *H01L 21/28247* (2013.01)

(58) Field of Classification Search
None
See application file for complete search history.

(56) References Cited

U.S. PATENT DOCUMENTS

| | | | |
|---|---|---|---|
| 8,765,531 B2 | 7/2014 | Gatterbauer et al. | |
| 2005/0069646 A1* | 3/2005 | Inoue | C23C 18/1844 257/E21.174 |
| 2007/0262468 A1* | 11/2007 | Nasu | H01L 24/16 257/778 |
| 2013/0154089 A1* | 6/2013 | Lee | H01L 21/4853 257/737 |
| 2015/0076688 A1* | 3/2015 | Daubenspeck | H01L 24/13 257/737 |
| 2017/0005038 A1* | 1/2017 | Lee | H01L 21/28556 |
| 2018/0366427 A1* | 12/2018 | Rogalli | H01L 24/05 |
| 2021/0066198 A1* | 3/2021 | Chen | H01L 23/3121 |

* cited by examiner

*Primary Examiner* — Alexander G Ghyka
(74) *Attorney, Agent, or Firm* — Murphy, Bilak & Homiller, PLLC

(57) ABSTRACT

A semiconductor device and a method of producing the semiconductor device are described. The semiconductor device includes: a semiconductor substrate; a metallization layer over the semiconductor substrate; a plating over the metallization layer, the plating including NiP; a passivation over the metallization layer and laterally adjacent the plating such that a surface of the plating that faces away from the semiconductor substrate is uncovered by the passivation, wherein a seam is present along an interface between the passivation and the plating; and a structure that covers the seam along a periphery of the plating and delimits a bondable area for the plating. The structure extends from the periphery of the plating onto the passivation. The structure includes an imide having a curing temperature below a recrystallization temperature of the NiP or an oxide having a deposition temperature below the recrystallization temperature of the NiP.

20 Claims, 8 Drawing Sheets

SEMICONDUCTOR DEVICE AND METHOD OF PRODUCING A SEMICONDUCTOR DEVICE

BACKGROUND

Many type of semiconductor devices use a plated AlCu metallization. For example, AlCu may be plated with NiP, Pd and Au. A passivation such as undoped silicate glass, silicon nitride, polyimide, etc. is then applied to the device, where part of the plated metallization stack is covered by the passivation and another part of the plated metallization stack is exposed to form one or more contact pads. The contact pads are used to form external electrical connections to the device, e.g., by wire bonding, ribbon bonding, metal clip attach, solder bumping, etc. However, common plating materials such as NiP, Pd and Au do not adhere well to common passivation materials, especially glass. A gap or seam, e.g., of a few 100 nm typically occurs along the interface between the metallization stack and passivation. The seam provides a pathway for water and other corrosive gases or liquids to penetrate the wiring layers of a semiconductor die. For example, a corrosive liquid may react with AlCu where the corresponding electric-chemical reaction erodes the AlCu below NiP. Other adverse chemical reactions may occur within the device as a result of a corrosive compound entering through the seam along the metallization stack-passivation interface.

Thus, there is a need for an improved metallization stack-passivation interface for semiconductor devices.

SUMMARY

According to an embodiment of a semiconductor device, the semiconductor device comprises: a semiconductor substrate; a metallization layer over the semiconductor substrate; a plating over the metallization layer, the plating comprising NiP; a passivation over the metallization layer and laterally adjacent the plating such that a surface of the plating that faces away from the semiconductor substrate is uncovered by the passivation, wherein a seam is present along an interface between the passivation and the plating; and a structure that covers the seam along a periphery of the plating and delimits a bondable area for the plating, wherein the structure extends from the periphery of the plating onto the passivation, wherein the structure comprises an imide having a curing temperature below a recrystallization temperature of the NiP or an oxide having a deposition temperature below the recrystallization temperature of the NiP.

According to an embodiment of a method of producing a semiconductor device, the method comprises: forming a metallization layer over a semiconductor substrate; forming a passivation over the metallization layer; forming a plating that comprises NiP over the metallization layer, wherein the passivation is laterally adjacent the plating such that a surface of the plating that faces away from the semiconductor substrate is uncovered by the passivation, wherein a seam is present along an interface between the passivation and the plating; and forming a structure that covers the seam along a periphery of the plating and delimits a bondable area for the plating, wherein the structure extends from the periphery of the plating onto the passivation, wherein forming the structure comprises curing an imide at a curing temperature below a recrystallization temperature of the NiP or depositing an oxide at a deposition temperature below the recrystallization temperature of the NiP.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of a structure for covering the seam between a plated metallization stack and a passivation of a semiconductor device. Corresponding methods of producing the structure are also described. The structure covers the seam along the periphery of the metallization plating so as to delimit a bondable area for the plating, where the plating comprises NiP (nickel phosphorous). The bondable area may be used to form external electrical connections to the device, e.g., by wire bonding, ribbon bonding, metal clip attach, solder bumping, etc. The structure extends from the periphery of the plating onto the passivation to cover but not necessarily fill the seam.

Recrystallization of the NiP component of the plating can cause a high degree of stress within the plated metallization stack, which can lead to structural damage. Recrystallization of NiP depends mainly on temperature, time, and phosphorous content. For example, depending on the phosphorous content, Ni—P clusters may begin to appear between 275 and 300° C. Accordingly, the recrystallization temperature for NiP plating may be in a range of 275 to 350° C. The amount of time required to complete the crystallization process may be minutes to hours, depending on the temperature.

The structure that covers the seam between the plated metallization stack and the passivation comprises an imide having a curing temperature below the recrystallization temperature of the NiP or an oxide having a deposition temperature below the recrystallization temperature of the NiP. Accordingly, the seam along the interface between the metallization stack and passivation may be covered by the structure without re-crystallizing the NiP contained in the plating during formation of the structure.

Described next, with reference to the figures, are exemplary embodiments of producing the structure that covers the seam between the passivation and the NiP-containing plating of the metallization stack, without re-crystallizing the NiP.

Figure 1:
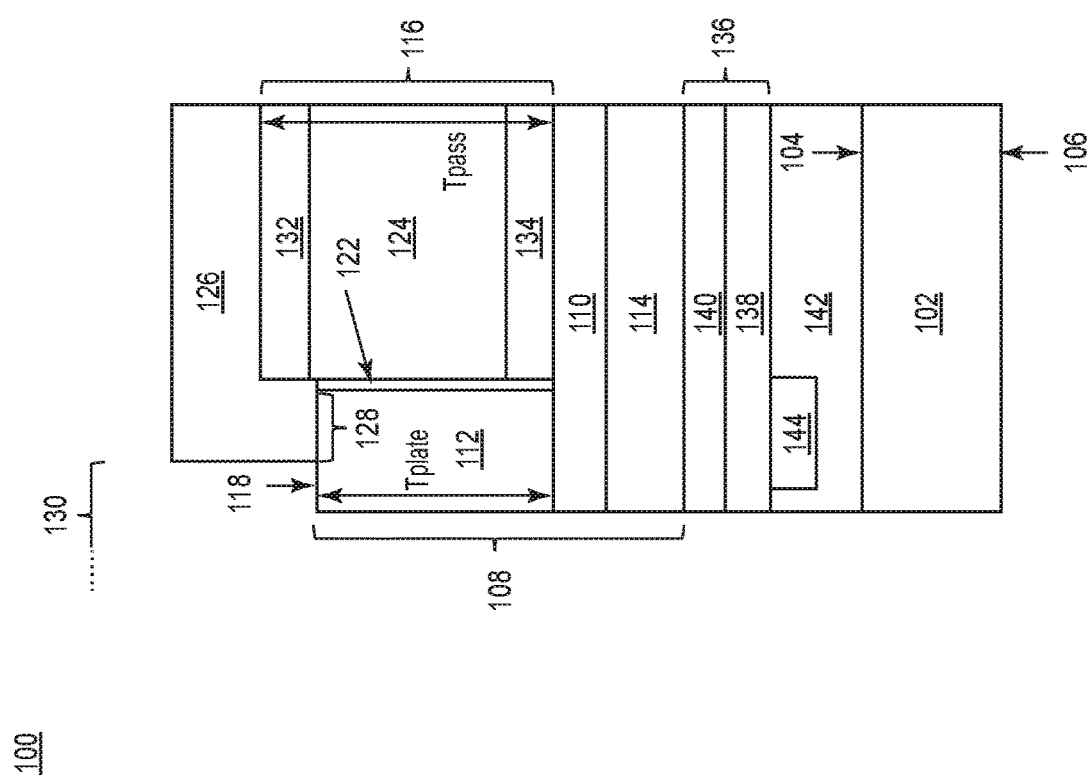
FIG. 1 illustrates a partial cross-sectional view of a semiconductor device.

FIG. 1 illustrates a partial cross-sectional view of a semiconductor device 100. The semiconductor device 100 includes a semiconductor substrate 102. The semiconductor substrate 102 may comprise any type of semiconductor material such as Si, SiC, GaN, etc. The semiconductor substrate 102 may include a base semiconductor and one or more epitaxial layers grown on the base semiconductor. The semiconductor device 100 may include 10s, 100s, 1000s or even more transistor cells that are electrically connected in parallel to form a transistor. For example, transistor cells may share a source or emitter connection, a drain or collector connection, and a gate connection. The resulting transistor may be a vertical device in that the primary current flow direction is between the front and back surfaces 104, 106 of the semiconductor substrate 102. The transistor instead may be a lateral device in that the primary current flow direction is along the front surface 104 of the semiconductor substrate 102. The transistor may be a power MOSFET (metal-oxide-semiconductor field-effect transistor), an IGBT (insulated gate bipolar transistor), a HEMT (high-electron mobility transistor), etc. The details of the transistor are omitted from FIG. 1 to emphasize the layers formed over the semiconductor substrate 102.

The layers formed over the semiconductor substrate 102 include a final metallization stack 108. The final metallization stack 108 is the uppermost wiring structure for the semiconductor device 100. The final metallization stack 108 includes a metallization layer 110 and a plating 112 formed over the metallization layer 110. The metallization layer 110 functions as a wiring structure, and the plating 112 comprises NiP. The plating 112 may include one or more additional metals or metal alloys. For example, the plating 112 may comprise NiP and a nobel metal such as Pd (palladium) or Au (gold).

The plating 112 may be structured to form one or more contact pads that provide contact points to form external electrical connections to the semiconductor device 100, e.g., by wire bonding, ribbon bonding, metal clip attach, solder bumping, etc. For example, in the case of a vertical power transistor, the plating 112 may be structured to include source/emitter and gate contact pads whereas the drain/collector pad may be formed at the back surface 106 of the semiconductor substrate 102. In the case of a lateral power transistor, the plating 112 may be structured to include all contact pads for the semiconductor device 100. The metallization layer 110 may be structured to ensure proper isolation between different potentials at the contact pads.

In one embodiment, the metallization layer 110 comprises an aluminum compound. For example, the metallization layer 110 may comprise AlCu or AlSiCu. Other metal systems may be used for the metallization layer 110, e.g., Cu, and one or more additional metallization layers 114 may be formed below and in contact with the metallization layer 110. For example, in the case of AlCu or AlSiCu as the metallization layer 110, the one or more additional metallization layers 114 may include TiN (titanium nitride) and/or Ti (titanium). In general, the final metallization stack 108 may include a plurality of metallization layers to enhance electromigration robustness, increase adhesion, improve thermal stability, reduce sheet resistance, etc. In each case, the metallization layer 110 acts as the uppermost wiring structure for the semiconductor device 100.

Only part of the plating 112 and metallization layer 110 are shown in FIG. 1 to emphasize the interface between the edge of the plating 112 and the edge of a passivation 116 formed over the metallization layer 110. The passivation 116 is disposed over the metallization layer 110 and laterally adjacent to the plating 112 such that a surface 118 of the plating 112 that faces away from the semiconductor substrate 102 is uncovered by the passivation 116. The surface 118 of the plating 112 that is uncovered by the passivation 116 may be plated, e.g., with Au. In either case, a seam (gap) 122 is present along the interface between the passivation 116 and the plating 112. The passivation 116 may comprise glass 124 such as USG (undoped silicate glass). NiP and Pd do not adhere well to glass, hence the seam 122. The seam 122 may be in the range of a few 100 nm, for example, between the edge of the plating 112 and the edge of the passivation 116.

To prevent corrosive gases and/or liquids from penetrating the final metallization stack 108 of the semiconductor device 100, a structure 126 is provided that covers the seam 122 along the periphery 128 of the plating 112 and delimits a bondable area 130 for the plating 112. Contact pad(s) are located in the bondable area 130.

The structure 126 extends from the periphery 128 of the plating 112 onto the passivation 116. The structure 126 may form a seal ring or frame that covers and seals the seam 122 between the passivation 116 and the plating 112 but does not fill the seam 122, where the structure 126 adheres to both the plating 112 and the passivation 116.

According to the embodiment illustrated in FIG. 1, the structure 126 comprises an imide having a curing temperature below the recrystallization temperature of the NiP contained in the plating 112. As explained above, the recrystallization temperature of the NiP may be in a range of 275 to 350° C. Accordingly, the imide that forms the structure 126 that covers the seam 122 between the plating 112 and the passivation 116 has a curing temperature below this range. Otherwise, the NiP may begin to recrystallize which leads to a stress increase within the final metallization stack 108. For example, a polyimide that is imidized (cured) at a temperature below the recrystallization temperature of the NiP contained in the plating 112 may be used for the structure 126.

The passivation 116 onto which the structure 126 extends may include a single material layer of more than one layer of different materials. For example, the passivation 116 may comprise one or more layers of oxide and/or nitride. In one embodiment, an uppermost layer 132 of the stack of electrically insulative layers may be an oxide or silicon nitride layer, where the structure 126 extends from the periphery 128 of the plating 112 onto the oxide or silicon nitride layer 132. A lowermost layer 134 of the stack of electrically insulative layers may also be an oxide or silicon nitride layer. The glass layer 124 is interposed between the uppermost and lowermost layers 132, 134 of the passivation, according to this embodiment. As shown in FIG. 1, the passivation 116 may be thicker (Tpass>Tplate) than the plating 112.

FIG. 1 shows the final metallization stack 108 as the only wiring layer/structure formed over the semiconductor substrate 102. However, one or more additional wiring layers may be formed between the final metallization stack 108 and the semiconductor substrate 102 and separated from one another by an ILD (interlayer dielectric) 136. The lowermost ILD 136 provides separation from the overlying wiring layers/structures and the semiconductor substrate 102. Each ILD 136 may comprise a single insulating layer or two or more different insulating layers. For example, the ILD 136 shown in FIG. 1 includes a lower oxide layer 138 such as TEOS (tetraethyl orthosilicate) and an upper glass layer 140 such as BPSG (borophosphosilicate glass).

In the case of a planar gate device, a gate oxide 142 is formed on the front surface 104 of the semiconductor substrate 102 and a gate electrode 144 is separated from the semiconductor substrate 102 by the gate oxide 142. For a trench gate device, the gate electrode 144 would be disposed in a trench formed in the semiconductor substrate 102 and the gate oxide 142 would line the sidewalls and bottom of the trench to separate the gate electrode 144 from the semiconductor substrate 102. As explained above, the semiconductor device 100 may include 10s, 100s, 1000s or even more planar gate or trench gate transistor cells that are electrically connected in parallel to form a transistor such as a power MOSFTE, IGBT, HEMT, etc.

Figure 2:
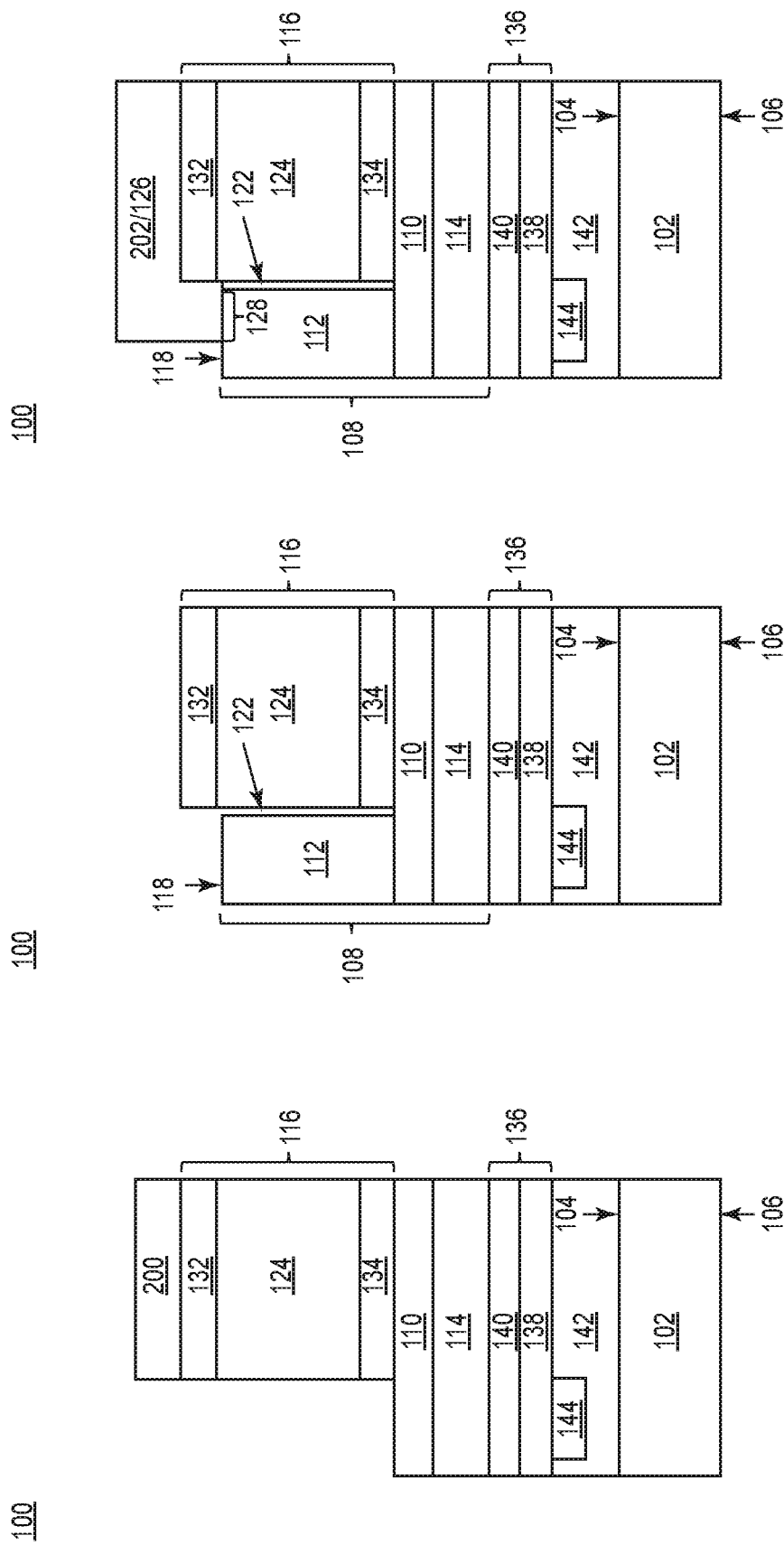
FIGS. 2A through 2C illustrate respective partial cross-sectional views of the semiconductor device of FIG. 1 during different stages of production.

FIGS. 2A through 2C illustrate an embodiment of forming the plating 112, the passivation 116 and the structure 126 that covers the seam 122 between the plating 112 and passivation 116.

FIG. 2A shows the semiconductor device 100 after the passivation 116 is formed on the metallization layer 110 of the final metallization stack 108, but before the plating 112 is formed over the metallization layer 110. The passivation 116 may be formed by depositing a stack of electrically insulative layers 134, 124, 132 on the metallization layer 110, forming a resist 200 on the stack of passivation layers 134, 124, 132, exposing the resist 200 to light using a mask to pattern the resist, developing the resist 200, structuring the resist 200 by curing, and etching the stack of passivation layers 134, 124, 132 using the structured resist 200. The resist 200 is removed after the passivation 116 is structured.

FIG. 2B shows the semiconductor device 100 after plating 112 the metallization layer 110 of the final metallization stack 108. As explained above, the plating 112 comprises at least NiP. The plating 112 may comprise one or more additional metals or metal alloys such as a nobel metal like Pd or Au. The upper surface 118 of the plating 112 may be plated, e.g., with Au.

FIG. 2C shows the semiconductor device 100 after forming the structure 126 that covers the seam 122 between the plating 112 and the passivation 116 along the periphery 128 of the plating 112. According to this embodiment, the structure 126 comprises an imide 202 having a curing temperature below the recrystallization temperature of the NiP contained in the plating 112. Further according to this embodiment, the structure 126 extends from the periphery 128 of the plating 112 onto the passivation 116. Accordingly, the structure 126 may form a seal ring or frame that covers and seals the seam 122 between the passivation 116 and the plating 112 but does not fill the seam 122. The low-temperature imide 202 may be cured at the curing temperature below the recrystallization temperature of the NiP such that the resulting structure 126 covers the entire passivation 116.

The low-temperature imide 202 may be formed by printing where the low-temperature imide 202 is applied only in the desired regions, and then cured. In another embodiment, the low-temperature imide 202 is formed by a spin-on process and developed in areas where the structure 126 is not to remain. The spin-on material is then cured and the developed material removed to form the final structure 126.

Figure 3:
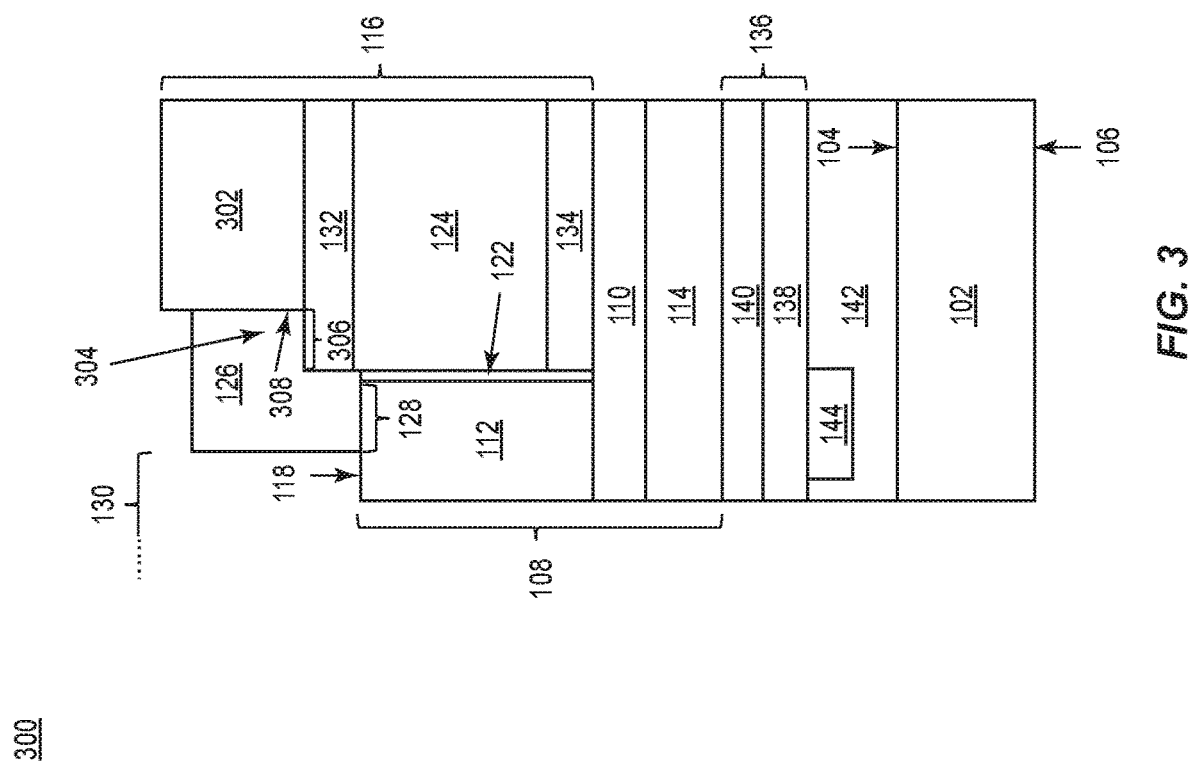
FIG. 3 illustrates a partial cross-sectional view of another embodiment of a semiconductor device.

FIG. 3 illustrates a partial cross-sectional view of another embodiment of a semiconductor device 300 having a seam 122 between the plating 112 of the final metallization stack 108 and the adjacent passivation 116. The embodiment illustrated in FIG. 3 is similar to the embodiment illustrated in FIG. 1. Accordingly, the material and structural features described with reference to the semiconductor device 100 shown in FIG. 1 also may be applied to the semiconductor device 300 shown in FIG. 3. Different, however, the passivation 116 for the semiconductor device 300 shown in FIG. 3 further includes a polyimide layer 302 as the uppermost passivation layer.

The polyimide layer 302 may be provided to establish the maximum electric field capability for the semiconductor device 300. Using an imide having a curing temperature below the recrystallization temperature of the NiP contained in the plating 112 as the structure 126 that covers the seam 122 between the plating 112 and the passivation 116 offers limited withstand voltage protection. Including the polyimide layer 302 in the passivation 116, the polyimide layer 302 having a higher curing temperature than the low-temperature imide 202 used to form the structure 126, offers higher withstand voltage protection. For example, in the case of a power MOSFET, the device 300 may withstand voltages up to 500V with the polyimide layer 302 in the passivation 116. For IGBTs, the device may withstand voltages above 500V with the polyimide layer 302 in the passivation 116. In general, the device breakdown voltage capability depends on the thickness and configuration of the polyimide layer 302. However, the polyimide layer 302 may have a curing temperature at or above the recrystallization temperature of the NiP contained in the plating 112 and therefore should be cured before formation of the plating 112 to avoid stress-induced damage caused by the recrystallization of NiP.

As shown in FIG. 3, the polyimide layer 302 may be pulled back to form a step 304. The structure 126 extends from the periphery 128 of the plating 112 onto the step 304, to cover the seam 122 between the plating 112 and the passivation 116.

The electrically insulative layer 132 immediately below the polyimide layer 302 may be an oxide or silicon nitride layer, as previously described herein. In FIG. 3, the structure 126 that covers the seam 122 between the plating 112 and the passivation 116 comprises an imide having a curing temperature below the recrystallization temperature of the NiP contained in the plating 112. Further in FIG. 3, the structure 126 contacts a section 306 of the oxide or silicon nitride layer 132 uncovered by the polyimide layer 302 and which forms the step 304. The structure 126 also contacts the sidewall 308 of the polyimide layer 302 that delimits the step 304.

FIGS. 4A through 4D illustrate an embodiment of forming the plating 112, the passivation 116 and the structure 126 that covers the seam 122 between the plating 112 and passivation 116 for the semiconductor device 300 shown in FIG. 3.

Figure 4:
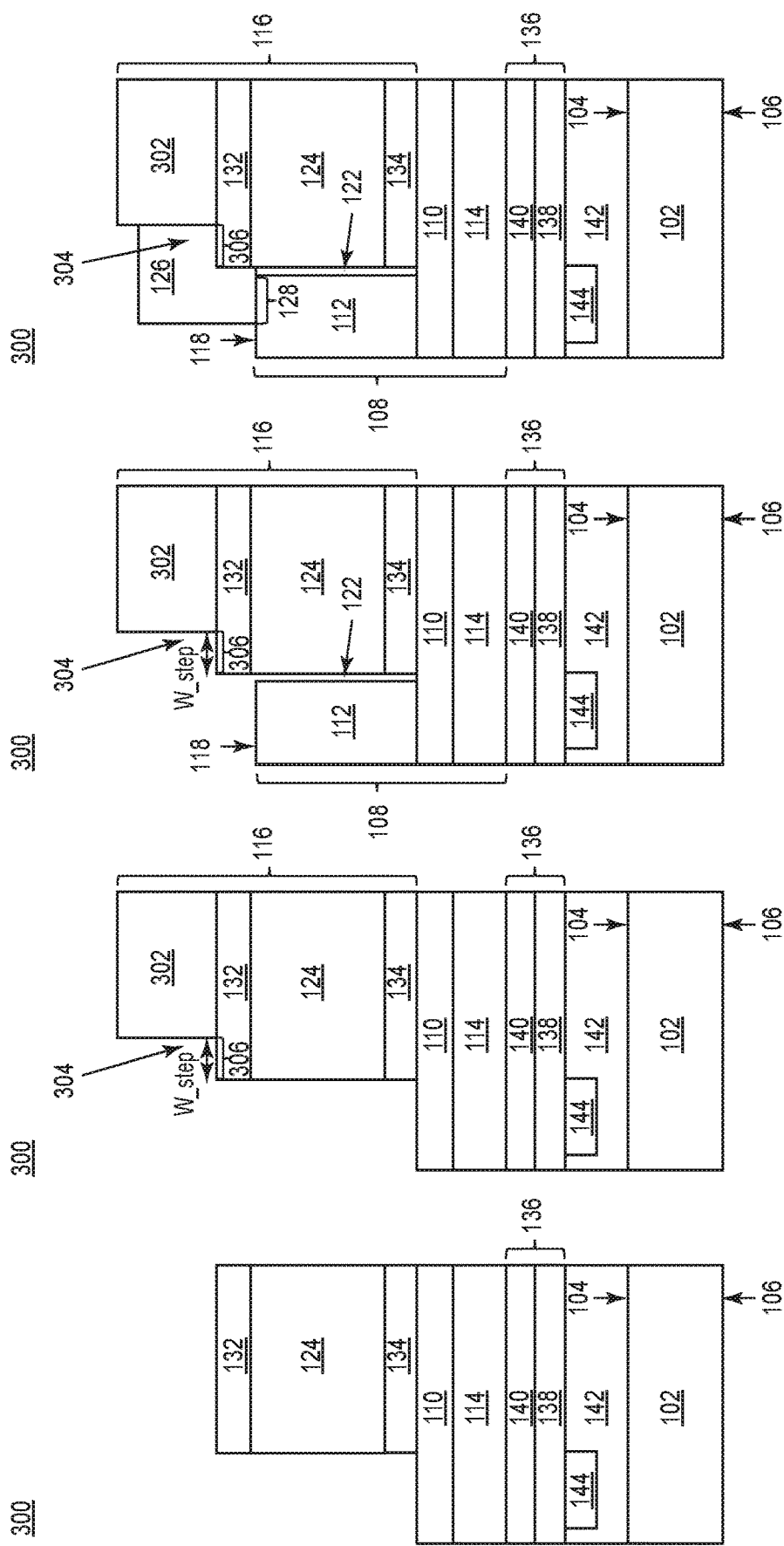
FIGS. 4A through 4D illustrate respective partial cross-sectional views of the semiconductor device of FIG. 3 during different stages of production.

FIG. 4A shows the semiconductor device 300 after each electrically insulative layer 134, 124, 132 of the passivation 116 except for the polyimide layer 302 is formed on the metallization layer 110 of the final metallization stack 108, and before the plating 112 is formed over the metallization layer 110. The electrically insulative layer 134, 124, 132 of the passivation 116 below the polyimide layer 302 may be formed as previously described herein in connection with FIG. 2A.

FIG. 4B shows the semiconductor device 300 after formation of the polyimide layer 302, including the step 304. The polyimide layer 302 may be formed by spinning a photo imide 400 onto the metallization layer 110 of the final metallization stack 108. Both the extent 'W_step' of the lateral pullback and curing of the photo imide 400 may be performed using a reticle mask/lithography process. The lateral pullback 'W-step' defines the size of the step 304 in the polyimide layer 302 and may be in the range of 10 to 20 microns, for example.

FIG. 4C shows the semiconductor device 300 after plating 112 the metallization layer 110 of the final metallization stack 108. As explained above, the plating 112 comprises at least NiP. The plating 112 may comprise one or more additional metals or metal alloys such as a nobel metal like Pd or Au. The surface 118 of the plating 112 that is uncovered by the passivation 116 may be plated, e.g., with Au.

FIG. 4D shows the semiconductor device 300 after forming the structure 126 that covers the seam 122 between the plating 112 and the passivation 116 along the plating periphery 128. According to this embodiment, the structure 126 comprises an imide having a curing temperature below the recrystallization temperature of the NiP contained in the plating 112 and the structure 126 extends from the periphery 128 of the plating 112 onto the passivation 116. The low-temperature imide may be formed by printing or a spin-on process, e.g., as previously described in connection with FIG. 2C.

Figure 5:
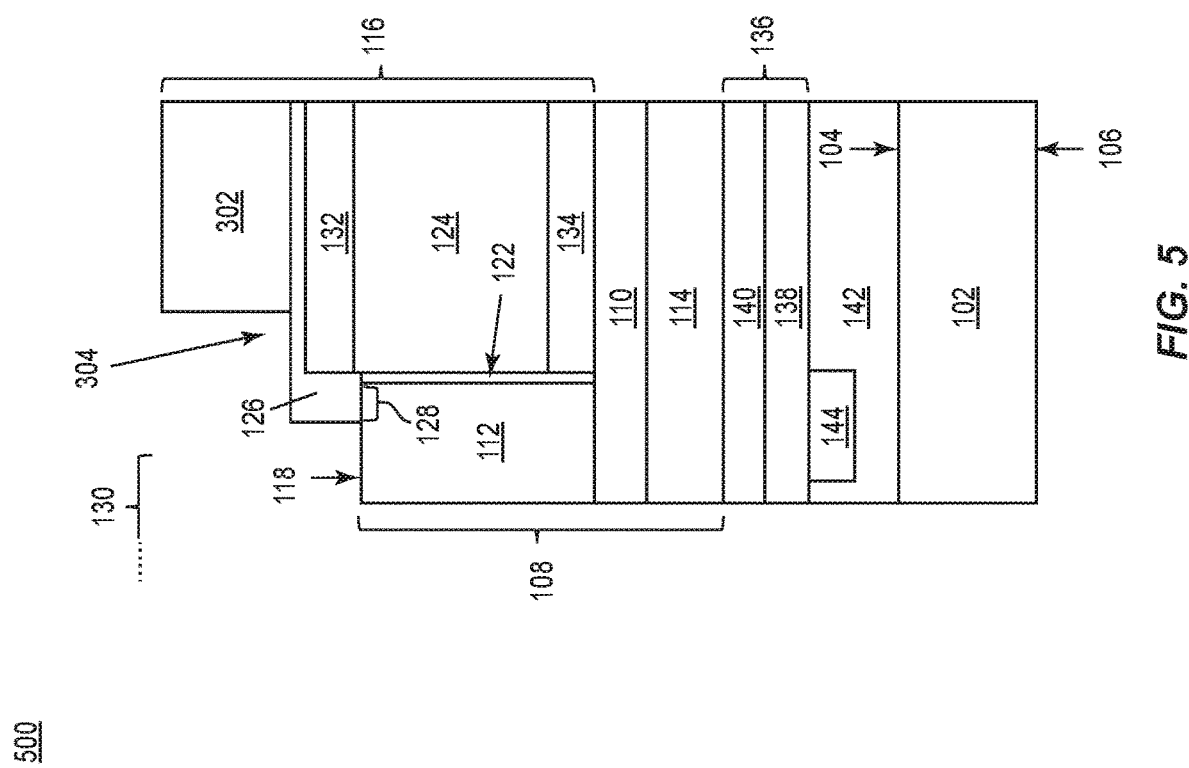
FIG. 5 illustrates a partial cross-sectional view of another embodiment of a semiconductor device.

FIG. 5 illustrates a partial cross-sectional view of another embodiment of a semiconductor device 500 having a seam 122 between the plating 112 of the final metallization stack 108 and the adjacent passivation 116. The embodiment illustrated in FIG. 5 is similar to the embodiments illustrated in FIGS. 1 and 3. Accordingly, the material and structural features described with reference to the semiconductor devices 100, 300 shown in FIGS. 1 and 3 also may be applied to the semiconductor device 500 shown in FIG. 5. Different, however, the structure 126 that covers the seam 122 along the periphery 128 of the plating 112 is an oxide having a deposition temperature below the recrystallization temperature of the NiP contained in the plating 112. For example, the oxide 600 may be a silicate glass such as PSG (phosphosilicate glass), BPSG (borophosphosilicate glass), etc., a metal oxide such as titanium oxide, aluminium oxide, etc. If the passivation 116 includes the polyimide layer 302 as shown in FIG. 5, the structure 126 may be interposed between the uppermost oxide or silicon nitride layer 132 of the passivation 116 and the polyimide layer 302 of the passivation 116. The polyimide 302 may have a curing temperature below the recrystallization temperature of the NiP contained in the plating 112, for example.

FIGS. 6A through 6D illustrate an embodiment of forming the plating 112, the passivation 116 and the structure 126 that covers the seam 122 between the plating 112 and passivation 116 for the semiconductor device 500 shown in FIG. 5.

Figure 6:
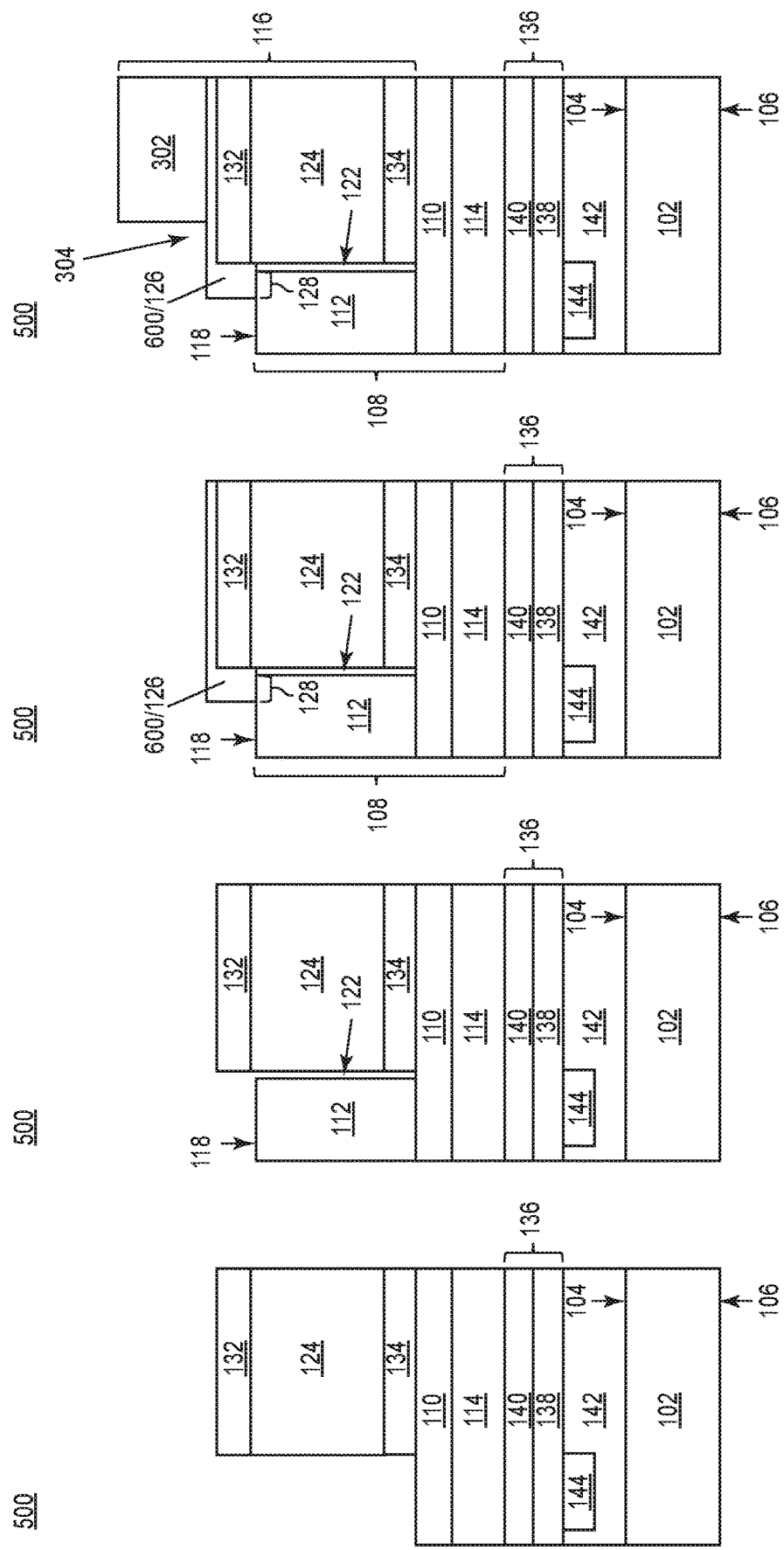
FIGS. 6A through 6D illustrate respective partial cross-sectional views of the semiconductor device of FIG. 5 during different stages of production.

FIG. 6A shows the semiconductor device 300 after each electrically insulative layer 134, 124, 132 of the passivation 116 except for the polyimide layer 302 is formed on the metallization layer 110 of the final metallization stack 108, and before the plating 112 is formed over the metallization layer 110. The electrically insulative layer 134, 124, 132 of the passivation 116 below the polyimide layer 302 may be formed as previously described herein in connection with FIG. 2A.

FIG. 6B shows the semiconductor device 300 after plating 112 the metallization layer 110 of the final metallization stack 108. As explained above, the plating 112 comprises at least NiP. The plating 112 may comprise one or more additional metals or metal alloys such as a nobel metal like Pd or Au. The upper surface 118 of the plating 112 may be plated, e.g., with Au.

FIG. 6C shows the semiconductor device 300 after forming the structure 126 that covers the seam 122 between the plating 112 and the passivation 116 along the periphery 128 of the plating 112. According to this embodiment, the structure 126 comprises an oxide 600 having a deposition temperature below the recrystallization temperature of the NiP contained in the plating 112. For example, the oxide 600 may be PSG, BPSG, titanium oxide, aluminium oxide, etc. The low-temperature oxide 600 may be formed by CVD (chemical vapour deposition) for covering larger seams 122 or ALD (atomic layer deposition) for covering smaller seams 122 of a few nm.

FIG. 6D shows the semiconductor device 300 after formation of the polyimide layer 302. The uppermost passivation layer 302 may be formed as previously described herein in connection with FIG. 4B, for example.

Alternative implementations for the method shown in FIGS. 6A through 6D may be used to produce the structure shown in FIG. 5. For example, starting with the device structure in FIG. 6A, the uppermost passivation layer 302, e.g., polyimide, may be formed over electrically insulative layer using a standard (high temperature) process. The plating 112 is then formed followed by formation of the structure 126 comprising an oxide 600 such that the seam 122 between the plating 112 of the final metallization stack 108 and the adjacent passivation 116 is covered. The oxide 600 has a deposition temperature below the recrystallization temperature of the recrystallization temperature of the NiP contained in the plating 112. Further processing steps may follow, like, e.g., structuring of the oxide 600.

Figure 7:
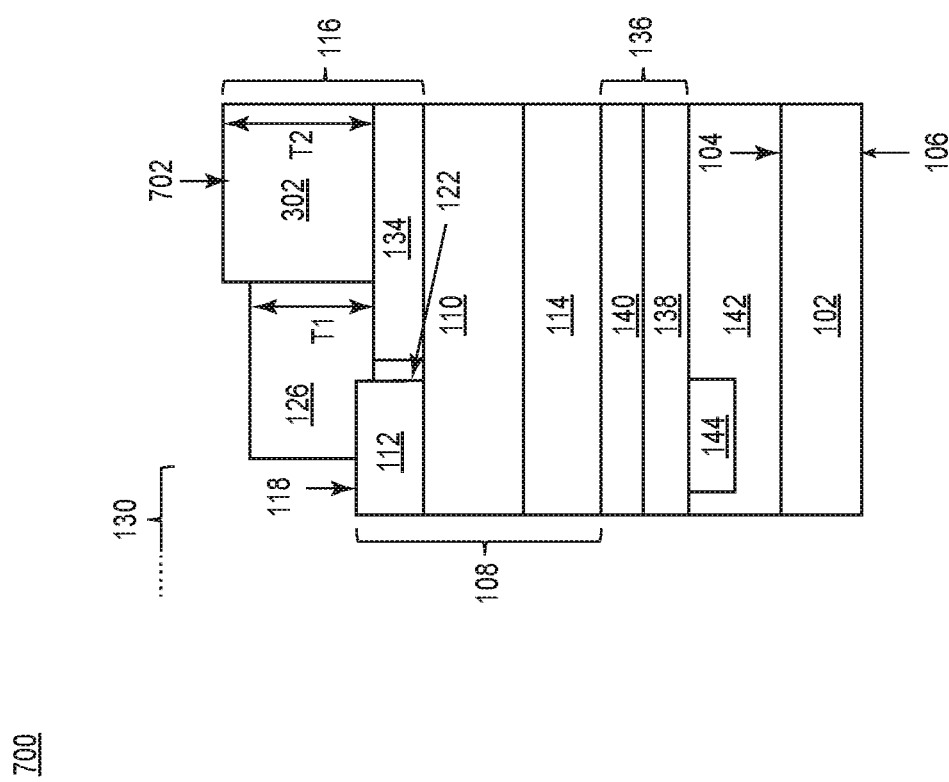
FIG. 7 illustrates a partial cross-sectional view of another embodiment of a semiconductor device.

FIG. 7 illustrates a partial cross-sectional view of another embodiment of a semiconductor device 700 having a seam 122 between the plating 112 of the final metallization stack 108 and the adjacent passivation 116. The embodiment illustrated in FIG. 7 is similar to the embodiments illustrated in FIGS. 1 and 3. Accordingly, the material and structural features described with reference to the semiconductor devices 100, 300 shown in FIGS. 1 and 3 also may be applied to the semiconductor device 700 shown in FIG. 7. Different, however, the passivation 116 includes a single oxide or silicon nitride layer 134. Also, the structure 126 that covers the seam 122 along the periphery 128 of the plating 112 is thinner (T1<T2) than the polyimide layer 302 of the passivation 116. Accordingly, the structure 126 contacts the sidewall of the polyimide layer 302 of the passivation 116 but does not extend onto the surface 702 of the polyimide layer 302 facing away from the semiconductor substrate 102.

Figure 8:
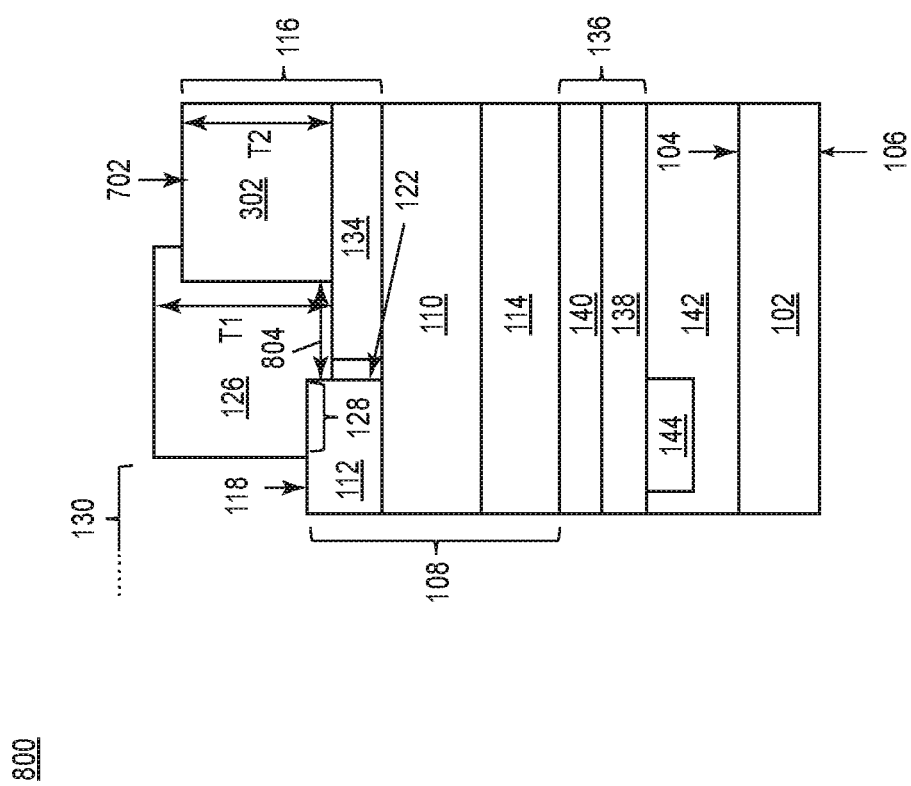
FIG. 8 illustrates a partial cross-sectional view of another embodiment of a semiconductor device.

FIG. 8 illustrates a partial cross-sectional view of another embodiment of a semiconductor device 800 having a seam 122 between the plating 112 of the final metallization stack 108 and the adjacent passivation 116. The embodiment illustrated in FIG. 8 is similar to the embodiment illustrated in FIG. 7. Accordingly, the material and structural features described with reference to the semiconductor device 700 shown in FIG. 7 also may be applied to the semiconductor device 800 shown in FIG. 8. Different, however, the structure 126 that covers the seam 122 along the periphery 128 of the plating 112 is thicker (T1>T2) than the polyimide layer 302 of the passivation 116. Also, the structure 126 extends from the periphery 128 of the plating 112 onto the surface 702 of the polyimide layer 302 that faces away from the semiconductor substrate 102.

In both FIGS. 7 and 8, the polyimide layer 302 of the passivation 116 is pulled back such that a gap 804 is present between a sidewall of the plating 112 and a sidewall of the polyimide layer 302. In one embodiment, the gap 804 is wider than the seam 122 between the plating 112 of the final metallization stack 108 and the passivation 116, and the structure 126 fills the gap 804 between the sidewall of the plating 112 and the sidewall of the polyimide layer 302. The structure 126 may not fill the seam 112, however, due to the size difference between the gap 804 and the seam 122.

Although the present disclosure is not so limited, the following numbered examples demonstrate one or more aspects of the disclosure.

Example 1. A semiconductor device, comprising: a semiconductor substrate; a metallization layer over the semiconductor substrate; a plating over the metallization layer, the plating comprising NiP; a passivation over the metallization layer and laterally adjacent the plating such that a surface of the plating that faces away from the semiconductor substrate is uncovered by the passivation, wherein a seam is present along an interface between the passivation and the plating; and a structure that covers the seam along a periphery of the plating and delimits a bondable area for the plating, wherein the structure extends from the periphery of the plating onto the passivation, wherein the structure comprises an imide having a curing temperature below a recrystallization temperature of the NiP or an oxide having a deposition temperature below the recrystallization temperature of the NiP.

Example 2. The semiconductor device of example 1, wherein the passivation comprises a stack of electrically insulative layers, wherein an uppermost layer of the stack of electrically insulative layers is an oxide or silicon nitride layer, and wherein the structure extends from the periphery of the plating onto the oxide or silicon nitride layer.

Example 3. The semiconductor device of example 1, wherein the passivation comprises a stack of electrically insulative layers, wherein an uppermost layer of the stack of electrically insulative layers is a polyimide layer, wherein the polyimide layer is pulled back to form a step, and wherein the structure extends from the periphery of the plating onto the step.

Example 4. The semiconductor device of example 3, wherein the electrically insulative layer of the stack of electrically insulative layers immediately below the polyimide layer is an oxide or silicon nitride layer, wherein the structure comprises the imide having the curing temperature below the recrystallization temperature of the NiP, and wherein the structure contacts a section of the oxide or silicon nitride layer uncovered by the polyimide layer and which forms the step.

Example 5. The semiconductor device of example 3, wherein the electrically insulative layer of the stack of electrically insulative layers immediately below the polyimide layer is an oxide or silicon nitride layer, wherein the structure comprises the oxide having the deposition temperature below the recrystallization temperature of the NiP, and wherein the structure is interposed between the oxide or silicon nitride layer and the polyimide layer.

Example 6. The semiconductor device of any of examples 3 through 5, wherein the structure is thinner than the polyimide layer, and wherein the structure contacts a sidewall of the polyimide layer that delimits the step.

Example 7. The semiconductor device of any of examples 3 through 5, wherein the structure is thicker than the polyimide layer, and wherein the structure extends from the periphery of the plating onto a surface of the polyimide layer that faces away from the semiconductor substrate.

Example 8. The semiconductor device of example 1, wherein an uppermost layer of the passivation is a polyimide layer, wherein the polyimide layer is pulled back such that a gap is present between a sidewall of the plating and a sidewall of the polyimide layer, wherein the gap is wider than the seam, and wherein the structure fills the gap between the sidewall of the plating and the sidewall of the polyimide layer.

Example 9. The semiconductor device of example 1, wherein an uppermost layer of the passivation is an oxide or silicon nitride layer, wherein the structure comprises the imide having the curing temperature below the recrystallization temperature of the NiP, and wherein the structure covers the entire passivation.

Example 10. The semiconductor device of any of examples 1 through 9, wherein the plating further comprises a noble metal over the NiP.

Example 11. The semiconductor device of any of examples 1 through 10, wherein the metallization layer comprises an aluminum compound.

Example 12. A method of producing a semiconductor device, the method comprising: forming a metallization layer over a semiconductor substrate; forming a passivation over the metallization layer; forming a plating that comprises NiP over the metallization layer, wherein the passivation is laterally adjacent the plating such that a surface of the plating that faces away from the semiconductor substrate is uncovered by the passivation, wherein a seam is present along an interface between the passivation and the plating; and forming a structure that covers the seam along a periphery of the plating and delimits a bondable area for the plating, wherein the structure extends from the periphery of the plating onto the passivation, wherein forming the structure comprises curing an imide at a curing temperature below a recrystallization temperature of the NiP or depositing an oxide at a deposition temperature below the recrystallization temperature of the NiP.

Example 13. The method of example 12, wherein: forming the passivation comprises forming a stack of electrically insulative layers over the metallization layer, an uppermost layer of the stack of electrically insulative layers being an oxide or silicon nitride layer; and the structure is formed so as to extend from the periphery of the plating onto the oxide or silicon nitride layer.

Example 14. The method of example 12, wherein: forming the passivation comprises forming a stack of electrically insulative layers over the metallization layer, an uppermost layer of the stack of electrically insulative layers being a polyimide layer, the polyimide layer being pulled back to form a step; and the structure is formed so as to extend from the periphery of the plating onto the step.

Example 15. The method of example 14, wherein: the electrically insulative layer of the stack of electrically insulative layers immediately below the polyimide layer is an oxide or silicon nitride layer; forming the structure comprises curing the imide at the curing temperature below the recrystallization temperature of the NiP; and the structure contacts a section of the oxide or silicon nitride layer uncovered by the polyimide layer and which forms the step.

Example 16. The method of example 14, wherein: the electrically insulative layer of the stack of electrically insulative layers immediately below the polyimide layer is an oxide or silicon nitride layer; and forming the structure comprises depositing, over the oxide or silicon nitride layer before the polyimide layer is formed, the oxide at the deposition temperature below the recrystallization temperature of the NiP such that the structure is interposed between the oxide or silicon nitride layer and the polyimide layer.

Example 17. The method of any of examples 14 through 16, wherein the structure is thinner than the polyimide layer, and wherein the structure is formed so as to contact a sidewall of the polyimide layer that delimits the step.

Example 18. The method of any of examples 14 through 16, wherein the structure is thicker than the polyimide layer, and wherein the structure is formed so as to extend from the periphery of the plating onto a surface of the polyimide layer that faces away from the semiconductor substrate.

Example 19. The method of example 12, wherein: forming the passivation comprises forming a polyimide layer over an oxide or silicon nitride layer, the polyimide layer being an uppermost layer of the passivation, the polyimide layer being pulled back such that a gap is present between a sidewall of the plating and a sidewall of the polyimide layer, the gap being wider than the seam; and the structure is formed so as to fill the gap between the sidewall of the plating and the sidewall of the polyimide layer.

Example 20. The method of example 12, wherein: forming the passivation comprises forming an oxide or silicon nitride layer, the oxide or silicon nitride layer being an uppermost layer of the passivation; and forming the structure comprises curing the imide at the curing temperature below the recrystallization temperature of the NiP such that the imide covers the entire passivation.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor substrate;
   a metallization layer over the semiconductor substrate;
   a plating over the metallization layer, the plating comprising NiP;
   a passivation over the metallization layer and laterally adjacent the plating such that a surface of the plating that faces away from the semiconductor substrate is uncovered by the passivation, wherein a seam is present along an interface between the passivation and the plating; and
   a structure that covers the seam along a periphery of the plating and delimits a bondable area for the plating, wherein the structure extends from the periphery of the plating onto the passivation,
   wherein the structure comprises an imide having a curing temperature below a recrystallization temperature of the NiP or an oxide having a deposition temperature below the recrystallization temperature of the NiP.

2. The semiconductor device of claim 1, wherein the passivation comprises a stack of electrically insulative layers, wherein an uppermost layer of the stack of electrically insulative layers is an oxide or silicon nitride layer, and wherein the structure extends from the periphery of the plating onto the oxide or silicon nitride layer.

3. The semiconductor device of claim 1, wherein the passivation comprises a stack of electrically insulative layers, wherein an uppermost layer of the stack of electrically insulative layers is a polyimide layer, wherein the polyimide layer is pulled back to form a step, and wherein the structure extends from the periphery of the plating onto the step.

4. The semiconductor device of claim 3, wherein the electrically insulative layer of the stack of electrically insulative layers immediately below the polyimide layer is an oxide or silicon nitride layer, wherein the structure comprises the imide having the curing temperature below the recrystallization temperature of the NiP, and wherein the structure contacts a section of the oxide or silicon nitride layer uncovered by the polyimide layer and which forms the step.

5. The semiconductor device of claim 3, wherein the electrically insulative layer of the stack of electrically insulative layers immediately below the polyimide layer is an oxide or silicon nitride layer, wherein the structure comprises the oxide having the deposition temperature below the recrystallization temperature of the NiP, and wherein the structure is interposed between the oxide or silicon nitride layer and the polyimide layer.

6. The semiconductor device of claim 3, wherein the structure is thinner than the polyimide layer, and wherein the structure contacts a sidewall of the polyimide layer that delimits the step.

7. The semiconductor device of claim 3, wherein the structure is thicker than the polyimide layer, and wherein the structure extends from the periphery of the plating onto a surface of the polyimide layer that faces away from the semiconductor substrate.

8. The semiconductor device of claim 1, wherein an uppermost layer of the passivation is a polyimide layer, wherein the polyimide layer is pulled back such that a gap is present between a sidewall of the plating and a sidewall of the polyimide layer, wherein the gap is wider than the seam, and wherein the structure fills the gap between the sidewall of the plating and the sidewall of the polyimide layer.

9. The semiconductor device of claim 1, wherein an uppermost layer of the passivation is an oxide or silicon nitride layer, wherein the structure comprises the imide having the curing temperature below the recrystallization temperature of the NiP, and wherein the structure covers the entire passivation.

10. The semiconductor device of claim 1, wherein the plating further comprises a noble metal over the NiP.

11. The semiconductor device of claim 1, wherein the metallization layer comprises an aluminum compound.

12. A method of producing a semiconductor device, the method comprising:
   forming a metallization layer over a semiconductor substrate;
   forming a passivation over the metallization layer;
   forming a plating that comprises NiP over the metallization layer, wherein the passivation is laterally adjacent the plating such that a surface of the plating that faces away from the semiconductor substrate is uncovered by the passivation, wherein a seam is present along an interface between the passivation and the plating; and
   forming a structure that covers the seam along a periphery of the plating and delimits a bondable area for the plating, wherein the structure extends from the periphery of the plating onto the passivation, wherein forming the structure comprises curing an imide at a curing temperature below a recrystallization temperature of the NiP or depositing an oxide at a deposition temperature below the recrystallization temperature of the NiP.

13. The method of claim 12, wherein:
forming the passivation comprises forming a stack of electrically insulative layers over the metallization layer, an uppermost layer of the stack of electrically insulative layers being an oxide or silicon nitride layer; and the structure is formed so as to extend from the periphery of the plating onto the oxide or silicon nitride layer.

14. The method of claim 12, wherein:
forming the passivation comprises forming a stack of electrically insulative layers over the metallization layer, an uppermost layer of the stack of electrically insulative layers being a polyimide layer, the polyimide layer being pulled back to form a step; and the structure is formed so as to extend from the periphery of the plating onto the step.

15. The method of claim 14, wherein:
the electrically insulative layer of the stack of electrically insulative layers immediately below the polyimide layer is an oxide or silicon nitride layer;

forming the structure comprises curing the imide at the curing temperature below the recrystallization temperature of the NiP; and the structure contacts a section of the oxide or silicon nitride layer uncovered by the polyimide layer and which forms the step.

16. The method of claim 14, wherein:
the electrically insulative layer of the stack of electrically insulative layers immediately below the polyimide layer is an oxide or silicon nitride layer; and forming the structure comprises depositing, over the oxide or silicon nitride layer before the polyimide layer is formed, the oxide at the deposition temperature below the recrystallization temperature of the NiP such that the structure is interposed between the oxide or silicon nitride layer and the polyimide layer.

17. The method of claim 14, wherein the structure is thinner than the polyimide layer, and wherein the structure is formed so as to contact a sidewall of the polyimide layer that delimits the step.

18. The method of claim 14, wherein the structure is thicker than the polyimide layer, and wherein the structure is formed so as to extend from the periphery of the plating onto a surface of the polyimide layer that faces away from the semiconductor substrate.

19. The method of claim 12, wherein:
forming the passivation comprises forming a polyimide layer over an oxide or silicon nitride layer, the polyimide layer being an uppermost layer of the passivation, the polyimide layer being pulled back such that a gap is present between a sidewall of the plating and a sidewall of the polyimide layer, the gap being wider than the seam; and the structure is formed so as to fill the gap between the sidewall of the plating and the sidewall of the polyimide layer.

20. The method of claim 12, wherein:
forming the passivation comprises forming an oxide or silicon nitride layer, the oxide or silicon nitride layer being an uppermost layer of the passivation; and forming the structure comprises curing the imide at the curing temperature below the recrystallization temperature of the NiP such that the imide covers the entire passivation.

* * * * *